United States Patent
Kim

(10) Patent No.: US 12,431,181 B2
(45) Date of Patent: Sep. 30, 2025

(54) MEMORY DEVICE AND MEMORY SYSTEM WITH TABLE TO DETERMINE REFRESH TIMING

(71) Applicant: SK hynix Inc., Gyeonggi-do (KR)

(72) Inventor: Minseong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 148 days.

(21) Appl. No.: 18/177,756

(22) Filed: Mar. 3, 2023

(65) Prior Publication Data

US 2024/0119986 A1    Apr. 11, 2024

(30) Foreign Application Priority Data

Oct. 11, 2022   (KR) ........................ 10-2022-0129438

(51) Int. Cl.
G11C 11/406    (2006.01)
G11C 11/4072   (2006.01)

(52) U.S. Cl.
CPC .. G11C 11/40615 (2013.01); G11C 11/40618 (2013.01); G11C 11/4072 (2013.01)

(58) Field of Classification Search
CPC ........ G11C 11/40615; G11C 11/40618; G11C 11/4072; G11C 7/1039; G11C 2211/4061; G11C 11/40611; G11C 11/4076; G11C 11/4085; G11C 11/4087
See application file for complete search history.

(56) References Cited

U.S. PATENT DOCUMENTS

| | | | |
|---|---|---|---|
| 8,938,573 B2 | 1/2015 | Greenfield et al. | |
| 2014/0241093 A1* | 8/2014 | Lee .................. | G11C 29/50016 365/222 |
| 2014/0344513 A1* | 11/2014 | Lo ..................... | G11C 11/40611 711/106 |
| 2021/0012832 A1* | 1/2021 | Devaux ............... | G06F 13/1668 |

FOREIGN PATENT DOCUMENTS

| | | | | |
|---|---|---|---|---|
| CN | 105242871 A | * | 1/2016 | ............... G06F 3/06 |
| CN | 110297780 A | * | 10/2019 | ......... G06F 12/0238 |
| KR | 10-2016-0000626 A | | 1/2016 | |
| KR | 10-2016-0068430 A | | 6/2016 | |

OTHER PUBLICATIONS

Storage Device and Computer System (Year: 2018).*
A Data Writing Method and Device; Year: 2016.*

* cited by examiner

*Primary Examiner* — Sultana Begum
(74) *Attorney, Agent, or Firm* — IP & T GROUP LLP

(57) ABSTRACT

A memory device includes a memory cell array including a plurality of rows; a time table including a plurality of fields respectively corresponding to the rows; and a refresh control circuit configured to read field data from a k-th field of the time table according to an access command for a k-th row among the rows, where k is a natural number, determine whether to issue a refresh request signal for the k-th row based on current clock data and the field data, and update the field data of the k-th field using the current clock data.

21 Claims, 15 Drawing Sheets

MEMORY DEVICE AND MEMORY SYSTEM WITH TABLE TO DETERMINE REFRESH TIMING

CROSS-REFERENCE TO RELATED APPLICATION

The present application claims the benefit of Korean Patent Application No. 10-2022-0129438, filed on Oct. 11, 2022, which is incorporated herein by reference in its entirety.

BACKGROUND

1. Field

Various embodiments of the present invention relate to a semiconductor design technology, and more particularly, to a semiconductor memory device for performing a refresh operation.

2. Description of the Related Art

A semiconductor memory device (e.g., a DRAM) includes a plurality of memory cells. Each memory cell may include a transistor serving as a switch and a capacitor storing charges corresponding to data. The data may have one of two logic levels, namely a high logic level (e.g., Logic 1) and a low logic level (e.g., Logic 0). The logic level of the data may depend on whether or not charges are stored in the capacitor, that is, whether the terminal voltage of the capacitor is high or low.

Since data are stored in the form of charges accumulated in the capacitor, theoretically storing data should not consume power. However, due to current leakage caused by a PN coupling of the transistor, an initial amount of charges stored in the capacitor of each memory cell may not be stably maintained. As a result, data stored in the memory cell may be lost. In an attempt to prevent losing data, data in the memory cell may be read before the data is lost and the capacitor may be recharged to ensure that a sufficient amount of charges is stored. This operation may be performed repeatedly at predetermined periods to retain accuracy of the data. This process of recharging a memory cell may be referred to as a refresh operation.

Due to the characteristics of a semiconductor memory device requiring a high-speed operation, the time required to periodically perform a refresh operation causes an operation speed of the semiconductor memory device to decrease and increase current consumption.

SUMMARY

Embodiments of the present invention are directed to provide a memory device capable of configuring a time table with a plurality of fields storing the last access time of a plurality of word lines, and independently requesting a refresh operation for each word line based on the time table.

Embodiments of the present invention are directed to provide a memory device capable of configuring a time table with a plurality of fields storing the number of activations as well as the last access time of a plurality of word lines, and independently requesting a refresh operation for each word line and/or adjacent word lines based on the time table.

According to an embodiment of the present invention, a memory device includes a memory cell array including a plurality of rows; a time table including a plurality of fields respectively corresponding to the rows; and a refresh control circuit configured to read field data from a k-th field of the time table according to an access command for a k-th row among the rows, where k is a natural number, determine whether to issue a refresh request signal for the k-th row based on current clock data and the field data, and update the field data of the k-th field using the current clock data.

According to an embodiment of the present invention, a memory device includes a memory cell array including a plurality of rows; a time table including a plurality of fields respectively corresponding to the rows, each field storing a last access time of a corresponding row as first field data; and a refresh control circuit configured to read the first field data from a k-th field of the time table according to an access command for a k-th row among the rows, where k is a natural number, and determine whether to issue a first refresh request signal for the k-th row based on current clock data and the first field data read from the k-th field.

According to an embodiment of the present invention, a memory system includes a memory controller; and a memory device including a memory cell array, which includes a plurality of word lines, and a table storing a latest access time for each word line, wherein the memory device is configured to: determine, through the table, a latest access time for a word line selected from among the plurality of the word lines; determine an interval between the latest access time and a current time; determine whether the interval is greater than or equal to a set refresh period; when it is determined that the interval is greater than or equal to the set refresh period, provide, to a memory controller, a refresh request signal; receive, from the memory controller, a refresh command in response to the refresh request signal; and refresh, in response to the refresh command, at least one word line corresponding to at least one refresh address including an address associated with the selected word line.

According to an embodiment of the present invention, an operating method of a memory device includes configuring a time table including a plurality of fields respectively corresponding to a plurality of rows of a memory cell array; activating one of a plurality of field selection signals by decoding a row address when an access command is input; reading first field data from a field of the time table selected according to the activated field selection signal, and updating the first field data of the selected field using current clock data; calculating an interval difference between an access time corresponding to the current clock data and an access time corresponding to the field data read from the selected field; and determining whether to issue a first refresh request signal according to a comparison result of a preset refresh period and the calculated interval.

The determining whether to issue a first refresh request signal includes issuing the first refresh request signal when the calculated interval difference is greater than or equal to the preset refresh period. The operating method further includes: providing the row address as a refresh address, to a memory controller, when the first refresh request signal is issued; and refreshing a row corresponding to an input address provided from the memory controller according to a refresh command provided from the memory controller. The operating method further includes: storing the row address when the first refresh request signal is issued, and providing the stored address as a refresh address according to a refresh command provided from a memory controller; and refreshing a row corresponding to the refresh address according to the refresh command. The operating method further includes: reading second field data from the selected field, and determining whether to issue a second refresh request signal based on a comparison result of a preset threshold number and the second field data read from the selected field; and increasing or initializing the second field data of the selected field depending on whether to issue the second refresh request signal. The increasing or initializing the second field data includes: increasing the second field data of the selected field when the second refresh request signal is not issued; and initializing the second field data of the selected field when the second refresh request signal is issued. The determining whether to issue a second refresh request signal includes: issuing the second refresh request signal when the second field data are greater than or equal to the preset threshold number. The operating method further includes: providing one or more adjacent addresses to the row address as a refresh address, to a memory controller, when the second refresh request signal is issued; and refreshing a row corresponding to an input address provided from the memory controller according to a refresh command provided from the memory controller. The operating method further includes: storing one or more adjacent addresses to the row address when the second refresh request signal is issued, and providing the stored address as a refresh address according to a refresh command provided from a memory controller; and refreshing a row corresponding to the refresh address according to the refresh command. The first refresh request signal is configured to request a refresh operation for a row corresponding to the selected field, and the second refresh request signal is configured to request a refresh operation for adjacent rows of a row corresponding to the selected field. The operating method further includes: initializing all of the first field data and the second field data of the time table according to a power-up signal.

DETAILED DESCRIPTION

Figure 1:
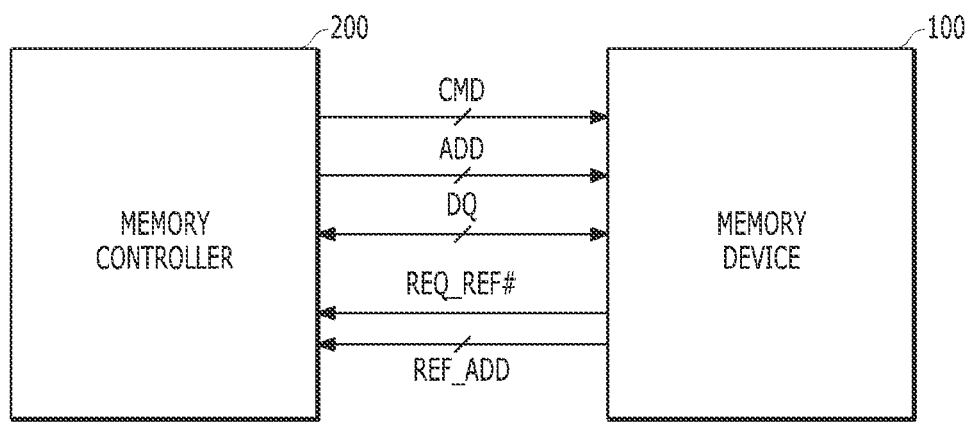
FIG. 1 is a block diagram illustrating a memory system in accordance with an embodiment of the present invention.

Specific structural and functional descriptions provided herein are directed to embodiments of the present invention. The present invention, however, is not limited to the embodiments described herein.

While embodiments are described in detail, the present invention is not limited to any specific detail. The present invention may be embodied in many different forms and should not be construed as being limited to any specific description. Rather, the present invention should be construed to cover not only the disclosed embodiments, but also various alternatives, modifications, equivalents, and other embodiments that fall within the spirit and scope of the present invention.

It will be understood that, although the terms "first", "second", etc. may be used herein to identify various elements, these elements should not be limited by these terms. These terms are only used to distinguish one element from another element that otherwise have the same or similar names. A first element in one instance could be termed a second element in another instance without departing from the teachings of the present invention.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or directly adjacent to" should be construed in the same way.

The terminology used herein is for the purpose of describing particular embodiments only and is not intended to be limiting. In the present invention, the singular forms are intended to include the plural forms as well, unless the context clearly indicates otherwise. It will be further understood that open ended terms, such as "comprise", "include", "have", etc., when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and should not be interpreted in an idealized or overly formal sense unless expressly so defined herein.

Detailed descriptions of functions and structures well known to those skilled in the art may be omitted to avoid obscuring the subject matter of the present invention. This aims to omit unnecessary description to make the subject matter of the present invention clear.

Various embodiments of the present invention are described more fully below with reference to the accompanying drawings, in which preferred embodiments of the present invention are shown, so that those skilled in the art can easily carry out and practice the present invention.

FIG. 1 is a block diagram illustrating a memory system 10 in accordance with an embodiment of the present invention.

Referring to FIG. 1, the memory system 10 may include a memory device 100 and a memory controller 200.

The memory device 100 may include a memory cell array in which a plurality of memory cells coupled between a plurality of rows (hereinafter, referred to as a plurality of word lines) and a plurality of columns (hereinafter, referred to as multiple bit lines) are arranged in an array form.

The memory controller 200 may control the overall operation of the memory device 100 by providing a command CMD and an address ADD to the memory device 100. The memory controller 200 may exchange data DQ with the memory device 100 during a read operation and a write operation. The memory controller 200 may output an active command, a precharge command, a refresh command, a read command, or a write command to the memory device 100 by transmitting the command CMD. The memory controller 200 may transmit the address ADD for selecting a word line of the memory device 100 together with the active command. The memory controller 200 may transmit the address ADD for selecting bit lines of the memory device 100 together with the read command or the write command.

The memory device 100 may perform an active operation, a precharge operation, a refresh operation, a read operation, and a write operation on the memory cell array according to the command CMD, the address ADD, and/or the data DQ provided from the memory controller 200. Depending on an embodiment, the memory device 100 may include a Dynamic Random Access Memory (DRAM) such as a Double Data Rate Synchronous DRAM (DDR SDRAM), a Low Power DDR (LPDDR) SDRAM, a Graphics DDR (GDDR) SDRAM, a Rambus DRAM (RDRAM) and the like.

According to an embodiment, the memory device 100 may include a time table configured by a plurality of fields respectively corresponding to the plurality of word lines. Each field of the time table may store the last activation time point (i.e., the last access time) of the corresponding word line as field data.

When an access command for a k-th word line is input, where k is a natural number, the memory device 100 may read field data from a k-th field among the fields and may determine whether to issue a refresh request signal REQ_REF based on current clock data and the read field data. The refresh request signal REQ_REF may be a signal for requesting a refresh operation for the k-th word line. In this case, the access command may include commands for accessing and activating the word line, e.g., the active command or the refresh command, and the access operation may include an operation for accessing and activating the word line in response to the access command. The memory device 100 may provide the current clock data to the k-th field to update the field data of the k-th field using the current clock data. Accordingly, each field of the time table may store the last access time of the corresponding word line as the field data. In addition, when the refresh request signal REQ_REF is issued, the memory device 100 may provide a row address, as a refresh address REF_ADD, designating the k-th word line to the memory controller 200. The configuration and operation of the memory device 100 will be described in detail with reference to FIGS. 2 to 6.

According to an embodiment, when the refresh request signal REQ_REF is input from the memory device 100, the memory controller 200 may generate the address ADD using the provided refresh address REF_ADD. The memory controller 200 may provide the address ADD generated together with the command CMD, i.e., the refresh command, to the memory device 100. Accordingly, the memory device 100 may perform a refresh operation on a word line corresponding to the address ADD in response to the refresh command.

That is, according to an embodiment, the memory controller 200 does not periodically transmit the refresh command for each refresh interval (i.e., tREFI) set in a specification of a memory device according to a standard (e.g., JEDEC (Joint Electron Device Engineering Council)), but instructs only the refresh operation for the word line that actually needs to be refreshed according to the refresh request signal REQ_REF. Accordingly, the memory device 100 may secure data retention time and minimize current consumption by performing the refresh operation optimized at different rates according to the actual access time of each word line.

Furthermore, in addition to the refresh operation, additional refresh operations (i.e., a target refresh operation) have recently been performed on memory cells of specific word lines that are likely to lose data due to the row hammer phenomenon. The row hammer phenomenon refers to a phenomenon in which data of memory cells connected to adjacent word lines are damaged due to a high number of activations of a specific word line. In order to prevent such a row hammer phenomenon, a target refresh operation is performed on adjacent word lines of a word line that are activated more than a predetermined number of times.

According to another embodiment, each field in the time table may store the last activation time point (i.e., the last access time) of a corresponding word line as first field data, and may store the number of activations of the corresponding word line as second field data.

When an access command for a k-th word line is input, where k is a natural number, the memory device 100 may read first field data and second field data from the k-th field among the fields. The memory device 100 may determine whether to issue a first refresh request signal REQ_REF1 based on current clock data and the read first field data. In addition, the memory device 100 may determine whether to issue a second refresh request signal REQ_REF2 based on a comparison result of a preset threshold number and the read second field data. In this case, the first refresh request signal REQ_REF1 may be a signal for requesting a refresh operation for the k-th word line, and the second refresh request signal REQ_REF2 may be a signal for requesting a refresh operation for adjacent word lines (e.g., k±1 word lines) to the k-th word line.

After the first and second field data are read from the k-th field, the memory device 100 may update the first field data of the k-th field using the current clock data, and may update the second field data of the k-th field to be increased by "+1" or initialized depending on whether the second refresh request signal REQ_REF2 is issued or not. Accordingly, each field of the time table may store the last access time of the corresponding word line as the first field data, and may store the cumulative number of activations of the corresponding word line as the second field data.

Further, when the first refresh request signal REQ_REF1 is issued, the memory device 100 may provide a row address, as a refresh address REF_ADD, designating the k-th word line to the memory controller 200. When the second refresh request signal REQ_REF2 is issued, the memory device 100 may provide a row address, as a refresh address REF_ADD, designating adjacent word lines of the k-th word line to the memory controller 200. The configuration and operation of the memory device 100 will be described in detail with reference to FIGS. 7 to 10.

According to another embodiment, when the first refresh request signal REQ_REF1 or the second refresh request signal REQ_REF2 is input from the memory device 100, the memory controller 200 may generate the address ADD using the provided refresh address REF_ADD. The memory controller 200 may provide the address ADD generated together with the command CMD, i.e., the refresh command, to the memory device 100. Accordingly, the memory device 100 may perform a refresh operation on a word line corresponding to the address ADD in response to the refresh command.

That is, according to an embodiment, the memory controller 200 does not periodically transmit a refresh command for each refresh interval (i.e., tREFI) set in the specification, but instructs only the refresh operation for the word line that actually needs to be refreshed according to the first refresh request signal REQ_REF1 or the second refresh request signal REQ_REF2. Accordingly, the memory device 100 not only performs an optimized refresh operation according to the actual access time of each word line, but also performs a target refresh operation on adjacent word lines according to the actual number of activations of each word line, thereby reducing the possibility of row hammer generation and minimizing current consumption during the refresh operation.

Hereinafter, a detailed configuration of the memory device 100 according to an embodiment of the present invention will be described with reference to the drawings. Hereinafter, in order to describe the gist of the present invention, a row control aspect related to a refresh operation will be mainly described.

Figure 2:
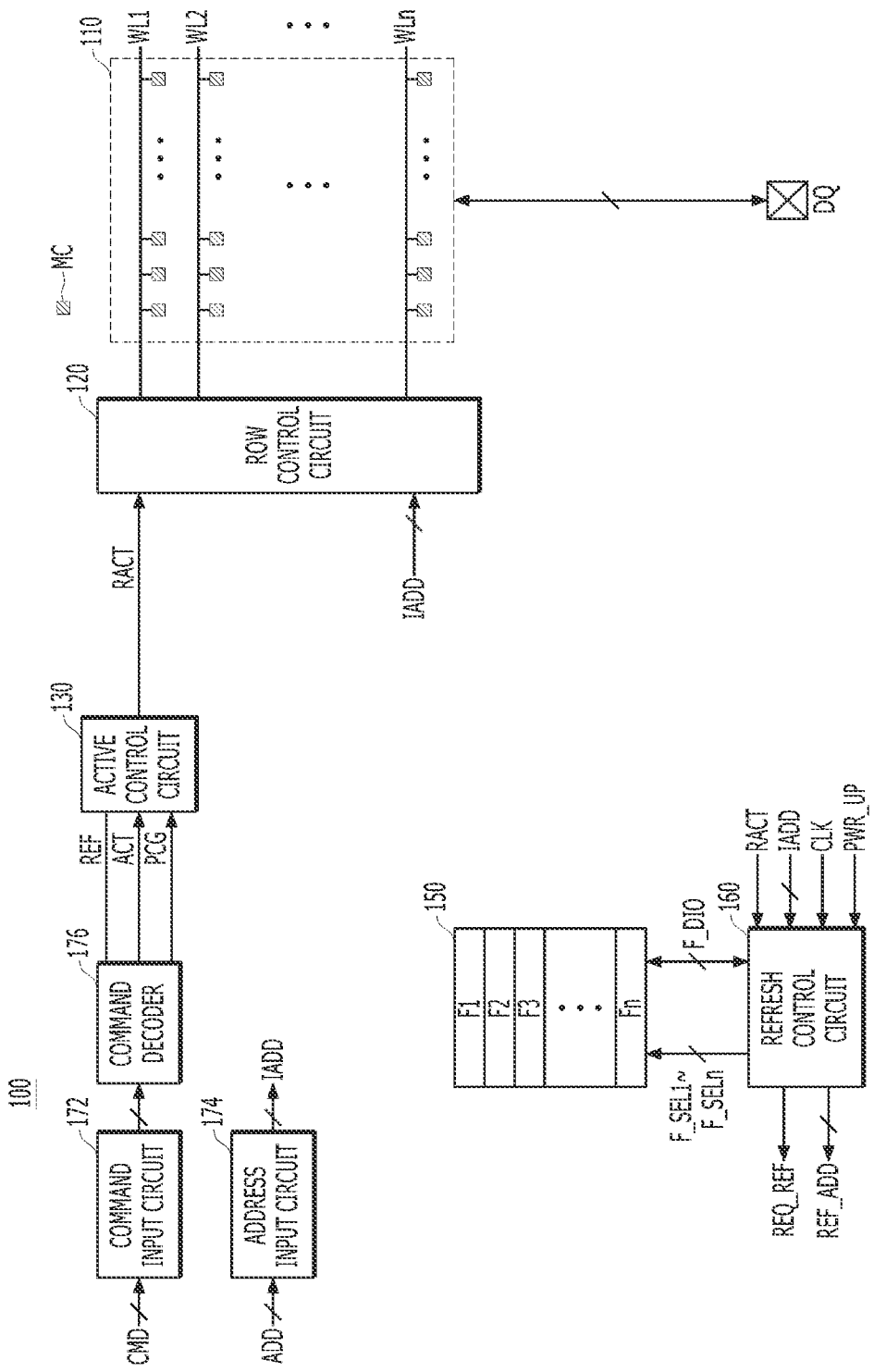
FIG. 2 is a detailed block diagram illustrating a memory device shown in FIG. 1 in accordance with an embodiment of the present invention.
Figure 3:
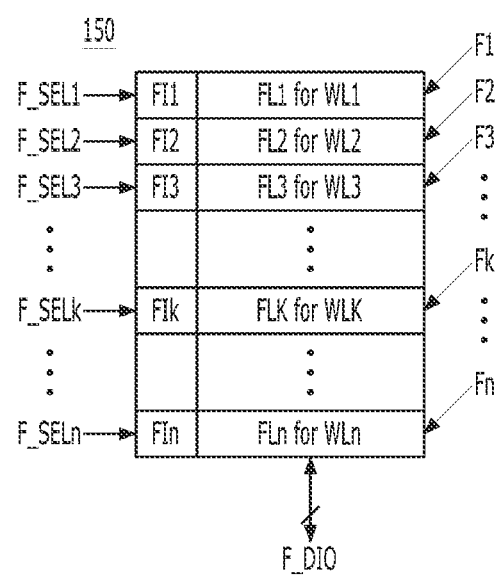
FIG. 3 is a detailed diagram illustrating a time table of FIG. 2 in accordance with an embodiment of the present invention.

FIG. 2 is a detailed block diagram illustrating the memory device 100 shown in FIG. 1 in accordance with an embodiment of the present invention. FIG. 3 is a detailed diagram illustrating a time table 150 of FIG. 2 in accordance with an embodiment of the present invention.

Referring to FIG. 2, the memory device 100 may include a memory cell array 110, a row control circuit 120, an active control circuit 130, a time table 150, a refresh control circuit 160, a command input circuit 172, an address input circuit 174, and a command decoder 176.

The memory cell array 110 may include a plurality of memory cells MC coupled to a plurality of word lines (e.g., first to n-th word lines WL1 to WLn) and a plurality of bit lines, arranged in an array form. The plurality of memory cells MC may include memory cells that require a refresh operation to secure a data retention time. The number of the memory cells MC may be determined according to the capacity of the memory device 100. The memory cell array 110 may output data DQ through the bit lines, and the data DQ may be output to an external device (e.g., the memory controller 200) through a data input/output pad.

The command input circuit 172 may receive a command CMD, and the address input circuit 174 may receive an address ADD, from the memory controller 200. The address input circuit 174 may receive the address ADD and output an internal input address IADD. Each of the command CMD and the address ADD may include a multi-bit signal. The command decoder 176 may decode the command CMD input through the command input circuit 172 and may generate an active command ACT, a precharge command PCG, and a refresh command REF. The command decoder 176 may generate a read command, a write command, a mode register command, and a calibration command as well as other commands, by decoding one or more received commands CMD.

The active control circuit 130 may generate a row active signal RACT according to the active command ACT, the precharge command PCG, and the refresh command REF. The active control circuit 130 may generate the row active signal RACT that is activated according to the active command ACT and deactivated according to the precharge command PCG. The active control circuit 130 may generate the row active signal RACT that is activated according to the refresh command REF and is deactivated for a minimum time of a row address strobe time (tRAS). The row active signal RACT is a signal for activating at least one of the first to n-th word lines WL1 to WLn. In an embodiment, the row active signal RACT may correspond to an access command for accessing and activating a word line.

The row control circuit 120 may activate at least one word line corresponding to the input address IADD according to the row active signal RACT. In this case, the input address IADD may include a row address.

The time table 150 may include first to n-th fields F1 to Fn corresponding to the first to n-th word lines WL1 to WLn, respectively. The first to n-th fields F1 to Fn may be selected according to first to n-th field selection signals F_SEL1 to F_SELn. Field data F_DIO stored in the selected field may be output to the refresh control circuit 160, or the field data F_DIO provided from the refresh control circuit 160 may be received and stored in the selected field. Referring to FIG. 3, the first to n-th fields F1 to Fn of the time table 150 may include field indexes FI1 to FIn and field lines FL1 to FLn, respectively. Each of the field indexes FI1 to FIn may be selected by a corresponding field selection signal among the first to n-th field selection signals F_SEL1 to F_SELn. Each of the field lines FL1 to FLn may output the stored field data F_DIO to the refresh control circuit 160 or store the field data F_DIO provided from the refresh control circuit 160. According to an embodiment, the time table 150 may be implemented as a register or a memory device (e.g., a static random access memory (SRAM), etc.) including the first to n-th fields F1 to Fn.

The refresh control circuit 160 may read the field data F_DIO from a field (e.g., a k-th field Fk) corresponding to a selected word line (e.g., a k-th word line WLk) selected from the first to n-th word lines WL1 to WLn. The refresh control circuit 160 may determine whether to issue a refresh request signal REQ_REF for the k-th word line WLk based on current clock data and the field data F_DIO.

More specifically, the refresh control circuit 160 may select the k-th word line WLk from the first to n-th word lines WL1 to WLn based on the input address IADD and the row active signal RACT, to activate the k-th field selection signal F_SELk corresponding to the selected k-th word line WLk. When the field data F_DIO are output from the k-th field Fk in response to the k-th field selection signal F_SELk, the refresh control circuit 160 may calculate a difference between the field data F_DIO and the current clock data generated based on an oscillating signal CLK that toggles with regular periods, and issue the refresh request signal REQ_REF when the calculated difference is greater than or equal to a preset refresh period. In this case, the preset refresh period may be determined according to a refresh period (tREF) set in the specification. The refresh period (tREF) may be defined as a retention time so that data stored in a memory cell is not lost. The refresh period (tREF) may be set in the specification as a time (e.g., 64 ms or 32 ms) required until a specific memory cell is refreshed again after the specific memory cell has been refreshed. The refresh control circuit 160 may update the field data F_DIO of the k-th field Fk using the current clock data regardless of whether the refresh request signal REQ_REF is issued. Accordingly, the k-th field Fk of the time table 150 may finally store the last access time of the k-th word line WLk.

In addition, when the refresh request signal REQ_REF is issued, the refresh control circuit 160 may provide a row address (i.e., the input address IADD) designating the selected k-th word line WLk to the memory controller 200 as a refresh address REF_ADD.

Figure 4:
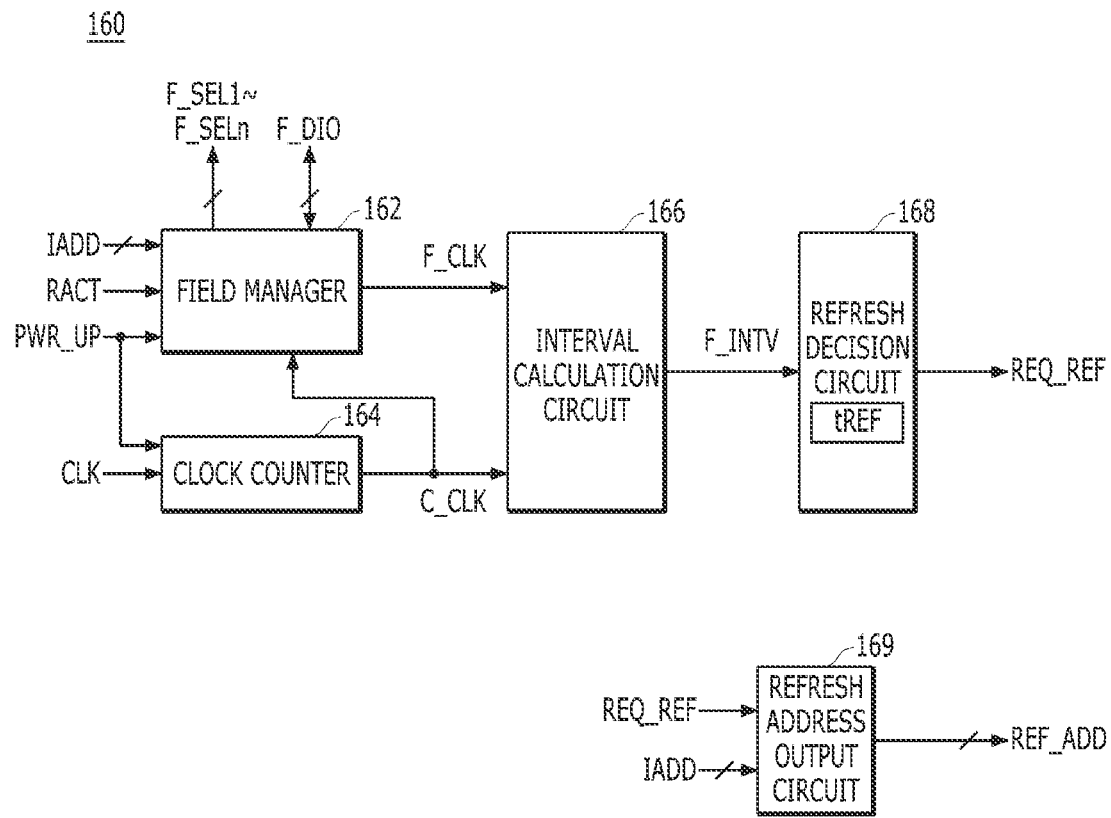
FIG. 4 is a detailed block diagram illustrating a refresh control circuit of FIG. 2 in accordance with an embodiment of the present invention.
Figure 5:
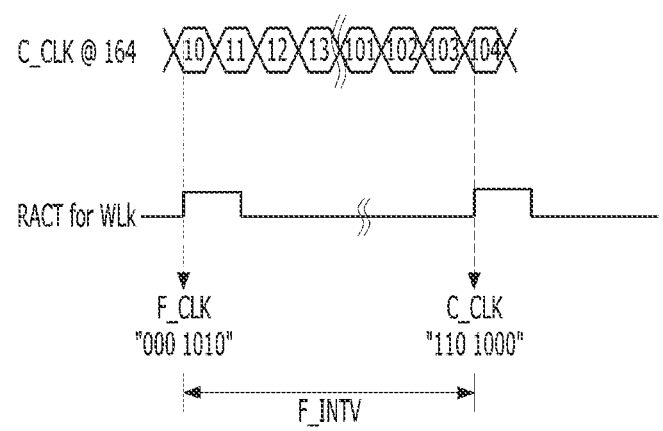
FIG. 5 is a timing diagram for describing an operation of an interval calculation circuit of FIG. 4 in accordance with an embodiment of the present invention.

FIG. 4 is a detailed block diagram illustrating the refresh control circuit 160 of FIG. 2 in accordance with an embodiment of the present invention. FIG. 5 is a timing diagram for describing an operation of an interval calculation circuit 166 of FIG. 4 in accordance with an embodiment of the present invention.

Referring to FIG. 4, the refresh control circuit 160 may include a field manager 162, a clock counter 164, an interval calculation circuit 166, a refresh decision circuit 168, and a refresh address output circuit 169.

The field manager 162 may manage the time table 150 by accessing the first to n-th fields F1 to Fn of the time table 150 and by reading or updating the field data F_DIO stored in the time table 150. When the row active signal RACT is activated, the field manager 162 may decode the input address IADD to activate one of the first to n-th field selection signals F_SEL1 to F_SELn. The field data F_DIO may be read from the selected field according to the activated field selection signal. The field manager 162 may provide the read field data F_DIO as field clock data F_CLK to the interval calculation circuit 166. The field manager 162 may update the field data F_DIO of the selected field using current clock data C_CLK by providing the current clock data C_CLK as the field data F_DIO of the selected field. In addition, the field manager 162 may initialize all field data F_DIO of the first to n-th fields F1 to Fn of the time table 150 according to a power-up signal PWR_UP.

The clock counter 164 may generate the current clock data C_CLK by counting the oscillating signal CLK periodically toggling according to the power-up signal PWR_UP. The current time may be specified according to the current clock data C_CLK.

The interval calculation circuit 166 may generate an interval signal F_INTV by calculating an interval between the current clock data C_CLK and the field clock data F_CLK. The interval calculation circuit 166 may calculate the interval signal F_INTV by subtracting a value of the field clock data F_CLK from a value of the current clock data C_CLK. Referring to FIG. 5, a time when the k-th word line WLk is finally accessed is stored as the field data F_DIO of the k-th field Fk. When the row active signal RACT for the k-th word line WLk is activated, the field manager 162 may provide the read field data F_DIO to the interval calculation circuit 166 as the field clock data F_CLK of "000 1010". Further, the interval calculation circuit 166 may calculate the interval signal F_INTV of "94 (decimal)" by subtracting the value "000 1010" (i.e., "10 (decimal)") of the field clock data F_CLK from the value "110 1000" (i.e., "104 (decimal)") of the current clock data C_CLK.

The refresh decision circuit 168 may determine whether the refresh request signal REQ_REF is issued or not according to a comparison result of the preset refresh period tREF and the calculated interval signal F_INTV. The refresh decision circuit 168 may issue the refresh request signal REQ_REF when the calculated interval signal F_INTV is greater than or equal to the preset refresh period tREF. For example, the refresh decision circuit 168 may activate the refresh request signal REQ_REF to a logic high level.

The refresh address output circuit 169 may provide the input address IADD to the memory controller 200 as the refresh address REF_ADD, when the refresh request signal REQ_REF is activated and issued at a logic high level.

Figure 6:
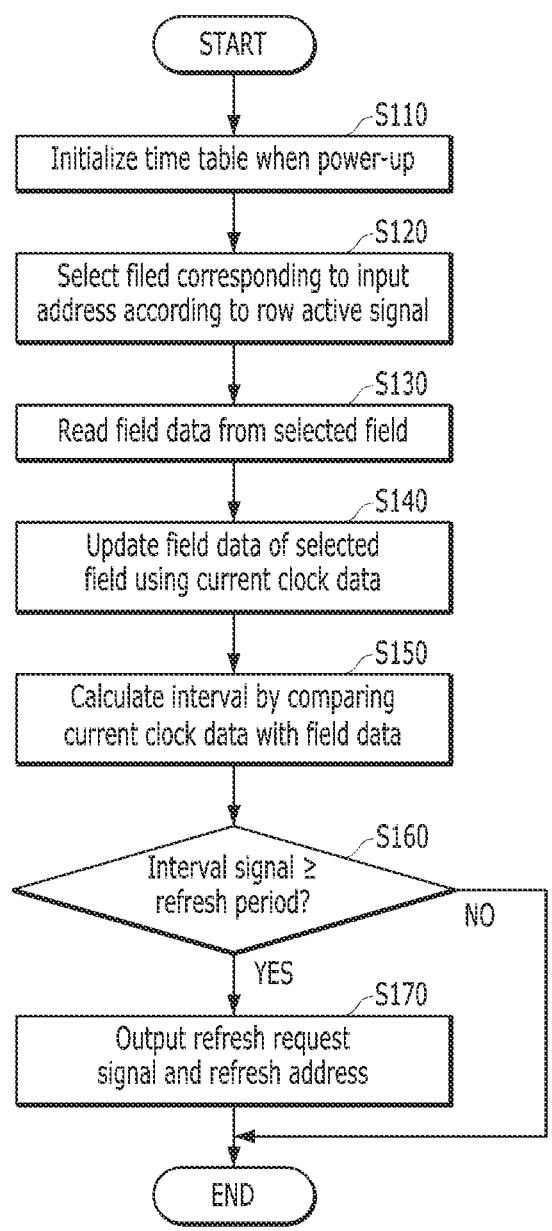
FIG. 6 is a flowchart for describing an operation of the memory device of FIG. 2 in accordance with an embodiment of the present invention.

FIG. 6 is a flowchart for describing an operation of the memory device 100 of FIG. 2 in accordance with an embodiment of the present invention.

Referring to FIG. 6, when power-up, the field manager 162 may initialize all field data F_DIO of the first to n-th fields F1 to Fn of the time table 150 according to the power-up signal PWR_UP (at operation S110). At this time, the clock counter 164 may start generating the current clock data C_CLK by counting the oscillating signal CLK.

When the active command ACT or the refresh command REF is input, the active control circuit 130 may activate the row active signal RACT. When the row active signal RACT is activated, the field manager 162 may decode the input address IADD to activate one of the first to n-th field selection signals F_SEL1 to F_SELn (at operation S120). The field data F_DIO may be read from the selected field of the time table 150 according to the activated field selection signal (at operation S130). The field manager 162 may provide the read field data F_DIO as the field clock data F_CLK to the interval calculation circuit 166.

Thereafter, the field manager 162 may update the field data F_DIO of the selected field using the current clock data C_CLK (at operation S140).

The interval calculation circuit 166 may generate the interval signal F_INTV by calculating an interval between the field clock data F_CLK and the current clock data C_CLK by comparing the field clock data F_CLK with the current clock data C_CLK (at operation S150).

The refresh decision circuit 168 may compare the preset refresh period tREF with the interval signal F_INTV and issue the refresh request signal REQ_REF (at operation S170) when the interval signal F_INTV is greater than or equal to the preset refresh period tREF ("YES" in operation S160). When the refresh request signal REQ_REF is issued, the refresh address output circuit 169 may provide the input address IADD to the memory controller 200 as the refresh address REF_ADD (at operation S170). On the other hand, when the calculated interval signal F_INTV is less than the preset refresh period tREF ("NO" in operation S160), the refresh decision circuit 168 may terminate the operation without issuing the refresh request signal REQ_REF.

When the refresh request signal REQ_REF is input from the memory device 100, the memory controller 200 may generate the address ADD using the refresh address REF_ADD provided together with the refresh request signal REQ_REF. The memory controller 200 may provide the address ADD together with the refresh command REF to the memory device 100. The row control circuit 120 of the memory device 100 may refresh a word line corresponding to the input address IADD in response to the row active signal RACT corresponding to the refresh command REF.

As described above, the memory device 100 according to the embodiment of the present invention may configure the time table with the plurality of fields storing the last access time of the word lines and request a refresh operation for each word line based on the time table. Accordingly, by performing the refresh operation optimized at different rates according to the actual access point of each word line, data retention time may be secured and current consumption may be minimized.

Figure 7:
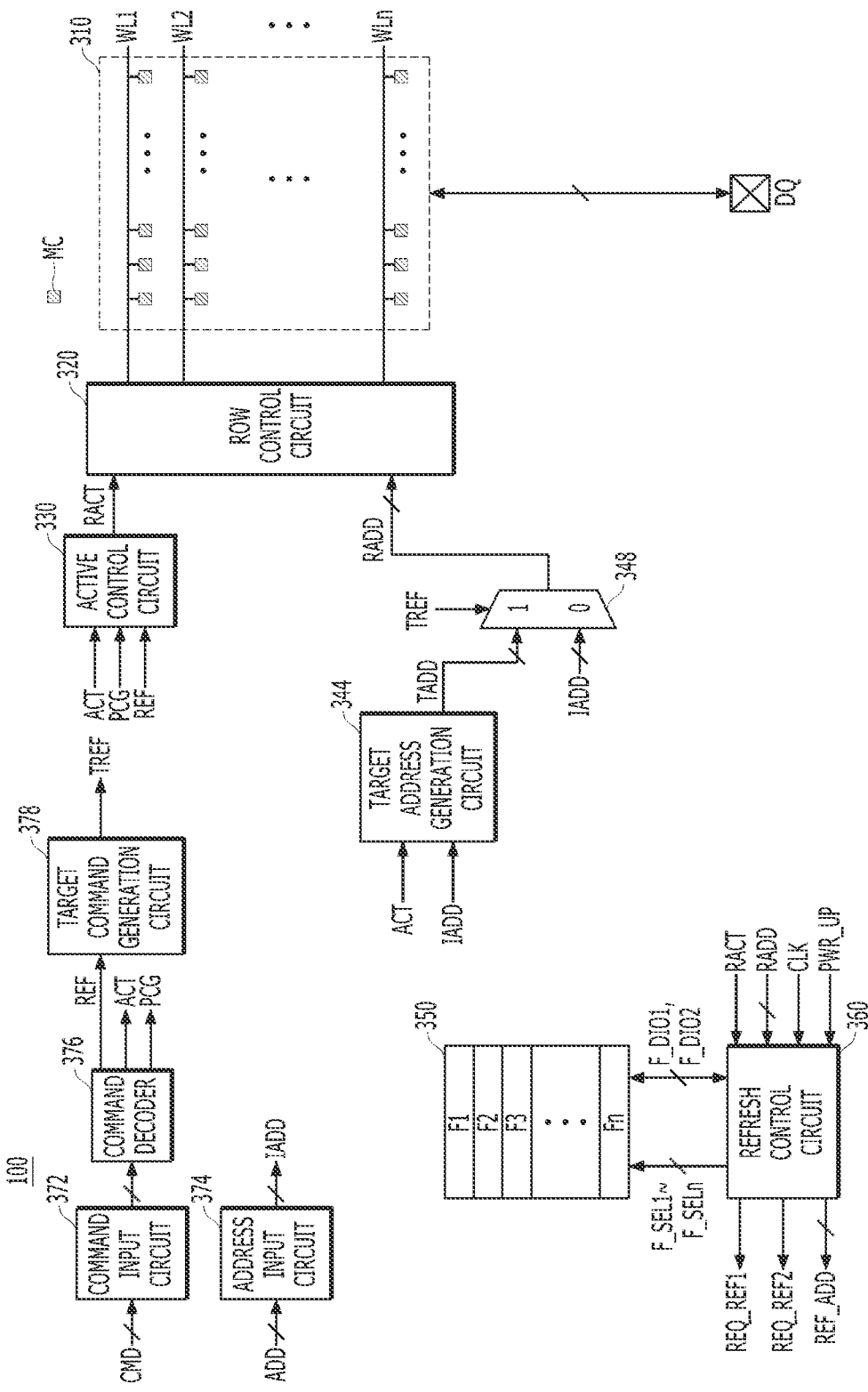
FIG. 7 is a detailed block diagram illustrating a memory device shown in FIG. 1 in accordance with another embodiment of the present invention.
Figure 8:
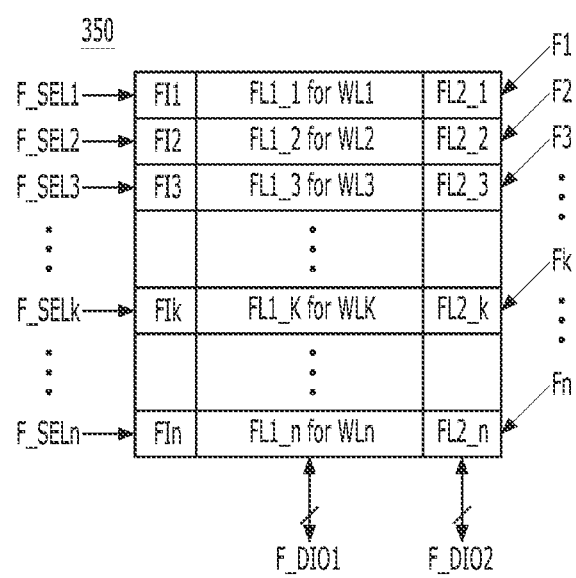
FIG. 8 is a detailed diagram illustrating a time table of FIG. 7 in accordance with another embodiment of the present invention.

FIG. 7 is a detailed block diagram illustrating the memory device 100 shown in FIG. 1 in accordance with another embodiment of the present invention. FIG. 8 is a detailed diagram illustrating a time table 350 of FIG. 7 in accordance with another embodiment of the present invention.

Referring to FIG. 7, the memory device 100 may include a memory cell array 310, a row control circuit 320, an active control circuit 330, a target address generation circuit 344, an address selection circuit 348, the time table 350, a refresh control circuit 360, a command input circuit 372, an address input circuit 374, a command decoder 376, and a target command generation circuit 378. Since the memory cell array 310, the row control circuit 320, the active control circuit 330, the command input circuit 372, the address input circuit 374, and the command decoder 376 of FIG. 7 have substantially the same configuration as those of FIG. 2, a detailed description will be omitted.

The target command generation circuit 378 may generate a target refresh command TREF based on a refresh command REF. The target command generation circuit 378 may generate the target refresh command TREF whenever the number of inputs of the refresh command REF reaches a predetermined number of times.

The target address generation circuit 344 may generate a target address TADD by sampling an input address IADD according to an active command ACT.

The address selection circuit 348 may select one of the target address TADD and the input address IADD in response to the target refresh command TREF, and output, to the row control circuit 320, the selected address as a row address RADD. For example, when the target refresh command TREF is generated to a logic high level, the address selection circuit 348 may output the row address RADD by selecting the target address TADD.

The time table 350 may include first to n-th fields F1 to Fn corresponding to the first to n-th word lines WL1 to WLn, respectively. The first to n-th fields F1 to Fn may be selected according to first to n-th field selection signals F_SEL1 to F_SELn. First field data F_DIO1 and second field data F_DIO2 stored in the selected field may be output to the refresh control circuit 360, or the first field data F_DIO1 and the second field data F_DIO2 provided from the refresh control circuit 360 may be received and stored in the selected field. Referring to FIG. 8, the first to n-th fields F1 to Fn of the time table 350 may include field indexes FI1 to FIn, first field lines FL1_1 to FL1_n, and second field lines FL2_1 to FL2_n, respectively. Each of the field indexes FI1 to FIn may be selected by a corresponding field selection signal among the first to n-th field selection signals F_SEL1 to F_SELn. The first field data F_DIO1 in each of the first field lines FL1_1 to FL1_n may be output to the refresh control circuit 360. The first field data F_DIO1 provided from the refresh control circuit 360 may be stored in each of the first field lines FL1_1 to FL1_n. The second field data F_DIO2 in each of the second field lines FL2_1 to FL2_n may be output to the refresh control circuit 360 or the second field data F_DIO2 provided from the refresh control circuit 360 may be stored in each of the second field lines FL2_1 to FL2_n.

The refresh control circuit 360 may read the first field data F_DIO1 and the second field data F_DIO2 from a field (e.g., a k-th field Fk) corresponding to a selected word line (e.g., a k-th word line WLk) selected from the first to n-th word lines WL1 to WLn. The refresh control circuit 360 may determine whether to issue a first refresh request signal REQ_REF1 based on current clock data and the first field data F_DIO1. Further, the refresh control circuit 360 may determine whether to issue a second refresh request signal REQ_REF2 based on a comparison result of a preset threshold number and the second field data F_DIO2. At this time, the first refresh request signal REQ_REF1 may be a signal for requesting a refresh operation for the k-th word line, and the second refresh request signal REQ_REF2 may be a signal for requesting a refresh operation for adjacent word lines (e.g., k±1 word lines) to the k-th word line.

The refresh control circuit 360 may update the first field data F_DIO1 using the current clock data, and update the second field data F_DIO2 to be increased by "+1" or initialized depending on whether the second refresh request signal REQ_REF2 is issued or not.

More specifically, the refresh control circuit 360 may select the k-th word line WLk from the first to n-th word lines WL1 to WLn based on the input address IADD and the row active signal RACT, to activate the k-th field selection signal F_SELk corresponding to the selected k-th word line WLk. When the first field data F_DIO1 are output from the k-th field Fk in response to the k-th field selection signal F_SELk, the refresh control circuit 360 may calculate a difference between the first field data F_DIO1 and the current clock data generated based on an oscillating signal CLK, and issue the first refresh request signal REQ_REF1 when the calculated difference is greater than or equal to a preset refresh period. In this case, the preset refresh period may be determined according to a refresh period (tREF) set in the specification. When the second field data F_DIO2 are output from the k-th field Fk in response to the k-th field selection signal F_SELk, the refresh control circuit 360 may determine whether to issue the second refresh request signal REQ_REF2 based on the comparison result of the preset threshold number and the second field data F_DIO2.

After the first field data F_DIO1 are read from the k-th field, the refresh control circuit 360 may update the first field data F_DIO1 of the k-th field Fk using the current clock data regardless of whether the first refresh request signal REQ_REF1 is issued. Further, after the second field data F_DIO2 are read from the k-th field, the refresh control circuit 360 may increase the second field data F_DIO2 of the k-th field Fk by "+1", or initialize the second field data F_DIO2 of the k-th field Fk, depending on whether the second refresh request signal REQ_REF2 is issued or not. Accordingly, the k-th field Fk of the time table 350 may finally store the last access time of the k-th word line WLk as the first field data F_DIO1, and store the cumulative number of activations of the k-th word line WLk as the second field data F_DIO2.

In addition, when the first refresh request signal REQ_REF1 is issued, the refresh control circuit 360 may provide the row address RADD designating the selected k-th word line WLk to the memory controller 200 as a refresh address REF_ADD. Further, in case where the second refresh request signal REQ_REF2 is issued, the refresh control circuit 360 may provide the row address RADD designating the adjacent word lines of the selected k-th word line WLk to the memory controller 200 as the refresh address REF_ADD.

Figure 9:
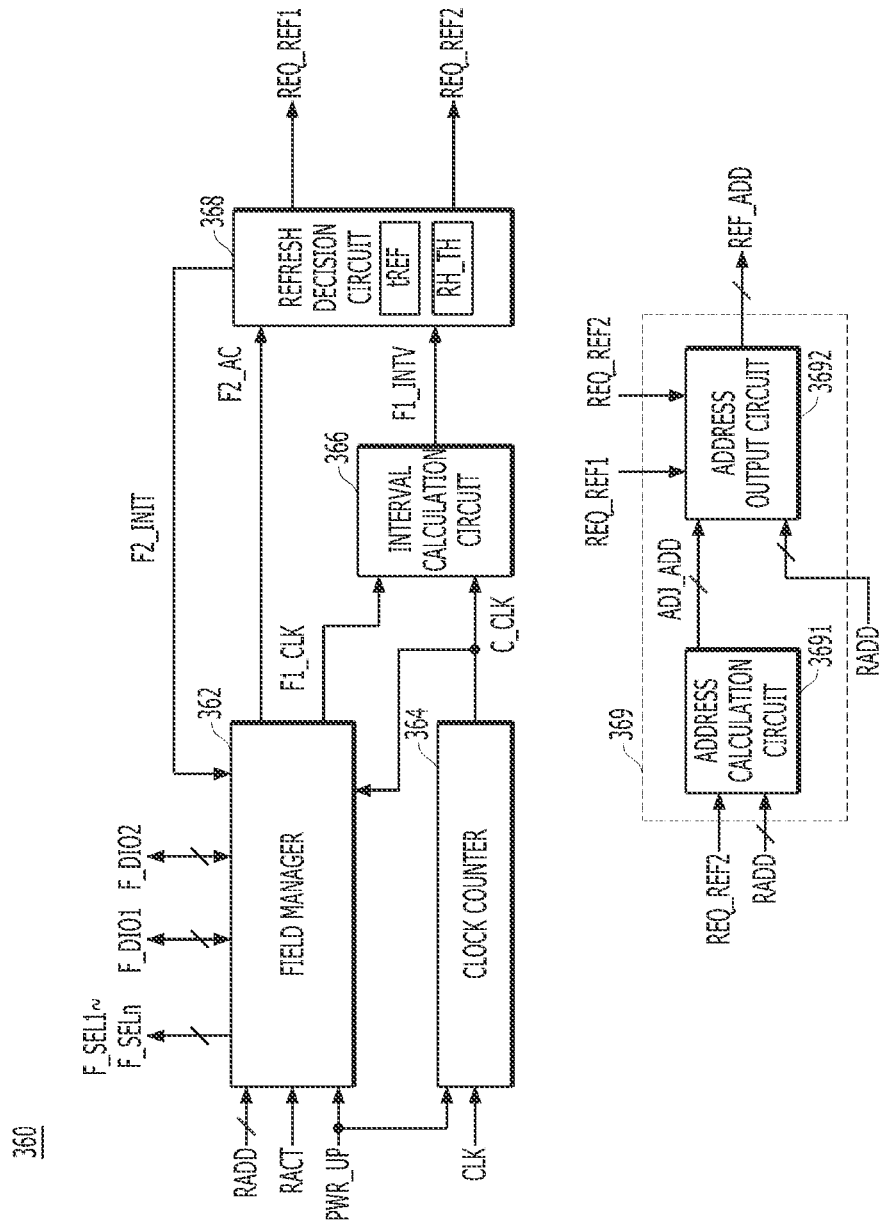
FIG. 9 is a detailed block diagram illustrating a refresh control circuit of FIG. 7 in accordance with another embodiment of the present invention.

FIG. 9 is a detailed block diagram illustrating the refresh control circuit 360 of FIG. 7 in accordance with another embodiment of the present invention.

Referring to FIG. 9, the refresh control circuit 360 may include a field manager 362, a clock counter 364, an interval calculation circuit 366, a refresh decision circuit 368, and a refresh address output circuit 369.

The field manager 362 may manage the time table 350 by accessing the first to n-th fields F1 to Fn of the time table 350 and reading or updating the first field data F_DIO1 and the second field data F_DIO2 stored in the time table 350. When the row active signal RACT is activated, the field manager 362 may decode the row address RADD to activate one of the first to n-th field selection signals F_SEL1 to F_SELn. The first field data F_DIO1 and the second field data F_DIO2 may be read from the selected field according to the activated field selection signal. The field manager 362 may provide the first field data F_DIO1 as field clock data F1_CLK to the interval calculation circuit 366, and provide the second field data F_DIO2 as field counting data F2_AC to the refresh decision circuit 368.

After the field clock data F1_CLK are outputted, the field manager 362 may update the first field data F_DIO1 of the selected field using current clock data C_CLK. After the field counting data F2_AC are outputted, the field manager 362 may increase or initialize the second field data F_DIO2 of the selected field, in response to a second field initialization signal F2_INIT. For example, the field manager 362 may initialize the second field data F_DIO2 when the second field initialization signal F2_INIT is activated to a logic high level, while increasing the second field data F_DIO2 by one (i.e., +1) when the second field initialization signal F2_INIT is deactivated to a logic low level. In addition, the field manager 362 may initialize all of the first field data F_DIO1 and the second field data F_DIO2 of the first to n-th fields F1 to Fn of the time table 350 according to a power-up signal PWR_UP.

The clock counter 364 may generate the current clock data C_CLK by counting the oscillating signal CLK periodically toggling according to the power-up signal PWR_UP. The current time may be specified according to the current clock data C_CLK.

The interval calculation circuit 366 may generate an interval signal F1_INTV by calculating an interval between the current clock data C_CLK and the field clock data F1_CLK. The interval calculation circuit 366 may calculate the interval signal F1_INTV by subtracting a value of the field clock data F1_CLK from a value of the current clock data C_CLK.

The refresh decision circuit 368 may determine whether the first refresh request signal REQ_REF1 is issued or not according to a comparison result of the calculated interval signal F1_INTV and the preset refresh period tREF. The refresh decision circuit 368 may determine whether the second refresh request signal REQ_REF2 is issued or not according to a comparison result of the field counting data F2_AC and a preset threshold number RH_TH. The refresh decision circuit 368 may issue the first refresh request signal REQ_REF1 when the calculated interval signal F1_INTV is greater than or equal to the preset refresh period tREF. The refresh decision circuit 368 may issue the second refresh request signal REQ_REF2 when the field counting data F2_AC is greater than or equal to the preset threshold number RH_TH. When it is determined to issue the second refresh request signal REQ_REF2, the refresh decision circuit 368 may activate the second field initialization signal F2_INIT to a logic high level and provide the second field initialization signal F2_INIT to the field manager 362.

The refresh address output circuit 369 may include an address calculation circuit 3691 and an address output circuit 3692.

The address calculation circuit 3691 may calculate one or more adjacent addresses ADJ_ADD using the row address RADD when the second refresh request signal REQ_REF2 is issued and activated to a logic high level. For example, the address calculation circuit 3691 may calculate the adjacent addresses ADJ_ADD by increasing and/or decreasing the row address RADD by "one (i.e., +1)". The address output circuit 3692 may provide the row address RADD as the refresh address REF_ADD according to the first refresh request signal REQ_REF1, and may sequentially provide the adjacent addresses ADJ_ADD as the refresh address REF_ADD according to the second refresh request signal REQ_REF2.

Figure 10:
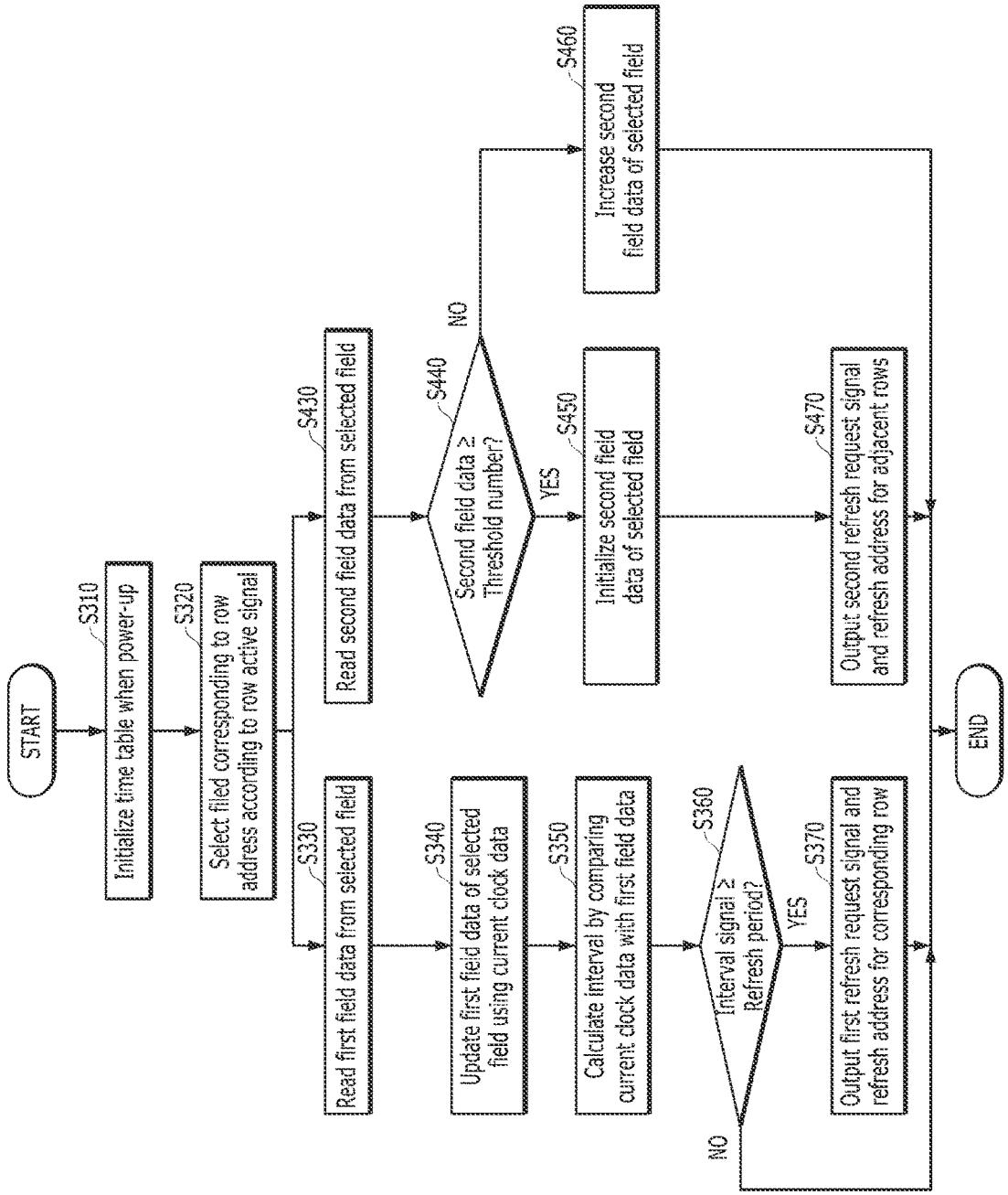
FIG. 10 is a flowchart for describing an operation of the memory device of FIG. 7 in accordance with another embodiment of the present invention.

FIG. 10 is a flowchart for describing an operation of the memory device 100 of FIG. 7 in accordance with an embodiment of the present invention.

Referring to FIG. 10, when power-up, the field manager 362 of FIG. 9 may initialize all of the first field data F_DIO1 and the second field data F_DIO2 of the first to n-th fields F1 to Fn according to the power-up signal PWR_UP (at operation S310). At this time, the clock counter 364 may start generating the current clock data C_CLK by counting the oscillating signal CLK.

When the active command ACT or the refresh command REF is input, the active control circuit 330 may activate the row active signal RACT. When the row active signal RACT is activated, the field manager 362 may decode the row address RADD to activate one of the first to n-th field selection signals F_SEL1 to F_SELn (at operation S320).

First, the first field data F_DIO1 may be read from the selected field according to the activated field selection signal (at operation S330). The field manager 362 may provide the first field data F_DIO1 as the field clock data F1_CLK to the interval calculation circuit 366. Then, the field manager 362 may update the first field data F_DIO1 of the selected field using the current clock data C_CLK (at operation S340). The interval calculation circuit 366 may generate the interval signal F1_INTV by calculating an interval between the field clock data F1_CLK and the current clock data C_CLK by comparing the field clock data F1_CLK with the current clock data C_CLK (at operation S350). When the interval signal F1_INTV is greater than or equal to the preset refresh period tREF ("YES" in operation S360), the refresh decision circuit 368 may issue the first refresh request signal REQ_REF1 (at operation S370). When the first refresh request signal REQ_REF1 is issued, the refresh address output circuit 369 may provide the row address RADD to the memory controller 200 as the refresh address REF_ADD (at operation S370). On the other hand, when the calculated interval signal F1_INTV is less than the preset refresh period tREF ("NO" In operation S360), the refresh decision circuit 368 may terminate the operation without issuing the first refresh request signal REQ_REF1.

When the first refresh request signal REQ_REF1 Is input from the memory device 100, the memory controller 200 may generate the address ADD using the refresh address REF_ADD provided together with the refresh request signal REQ_REF. The memory controller 200 may provide the address ADD together with the refresh command REF to the memory device 100. The row control circuit 320 of the memory device 100 may refresh a word line corresponding to the row address RADD in response to the refresh command REF.

Next, the second field data F_DIO2 may be read from the selected field according to the activated field selection signal (at S430). The field manager 362 may provide the second field data F_DIO2 as the field counting data F2_AC to the refresh decision circuit 368. When the field counting data F2_AC is greater than or equal to the preset threshold number RH_TH ("YES" in S440), the refresh decision circuit 368 may issue the second refresh request signal REQ_REF2 (at S470). When it is determined that the second refresh request signal REQ_REF2 is issued, the refresh decision circuit 368 may activate the second field initialization signal F2_INIT to a logic high level, and the field manager 362 may initialize the second field data F_DIO2 of the selected field (at S450). When the second refresh request signal REQ_REF2 is issued, the refresh address output circuit 369 may calculate one or more adjacent addresses ADJ_ADD using the row address RADD and sequentially provide the adjacent addresses ADJ_ADD as the refresh address REF_ADD (at S470).

On the other hand, when the field count data F2_AC is less than the preset threshold number RH_TH ("NO" in S440), the refresh decision circuit 368 may terminate the operation without issuing the second refresh request signal REQ_REF2. When the second refresh request signal REQ_REF2 is not issued, the refresh decision circuit 368 may deactivate the second field initialization signal F2_INIT to the logic low level, and the field manager 362 may increase the second field data F_DIO2 by "one (i.e., +1)" (at S460).

When the second refresh request signal REQ_REF2 is input from the memory device 100, the memory controller 200 may generate the address ADD using the refresh address REF_ADD provided together with the refresh request signal REQ_REF. The memory controller 200 may provide the address ADD together with the refresh command REF to the memory device 100. The row control circuit 320 of the memory device 100 may refresh a word line corresponding to the input address IADD in response to the refresh command REF.

Moreover, when the active command ACT is input, the target address generation circuit 344 may generate the target address TADD by sampling the input address IADD. The target command generation circuit 378 may generate the target refresh command TREF whenever the number of inputs of the refresh command REF reaches a predetermined number of times. When the target refresh command TREF is generated, the address selection circuit 348 may select and output the target address TADD as the row address RADD, and the row control circuit 320 may perform a target refresh operation by refreshing the word line corresponding to the row address RADD in response to the row active signal RACT.

In the above embodiments, the memory device 100 may provide the refresh address REF_ADD to the memory controller 200 together with the refresh request signal REQ_REF, but the present invention is not limited thereto. In the following embodiments, a method in which a memory device stores a refresh address for a refresh operation without providing the refresh address to a memory controller will be described.

Figure 11:
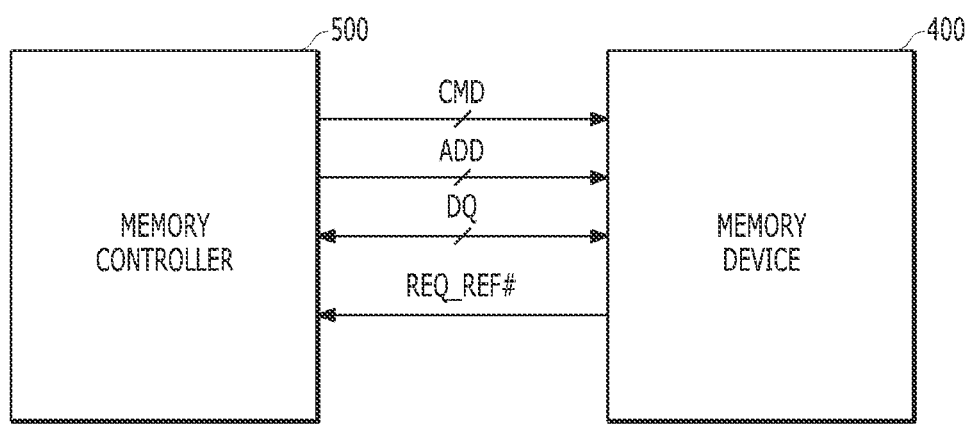
FIG. 11 is a block diagram illustrating a memory system in accordance with an embodiment of the present invention.

FIG. 11 is a block diagram illustrating a memory system 20 in accordance with an embodiment of the present invention.

Referring to FIG. 11, the memory system 20 may include a memory device 400 and a memory controller 500. The memory device 400 and the memory controller 500 of FIG. 11 may have substantially the same configuration as the memory device 100 and the memory controller 200 of FIG. 1, except that the memory device 400 does not provide a refresh address REF_ADD to the memory controller 500.

Figure 12:
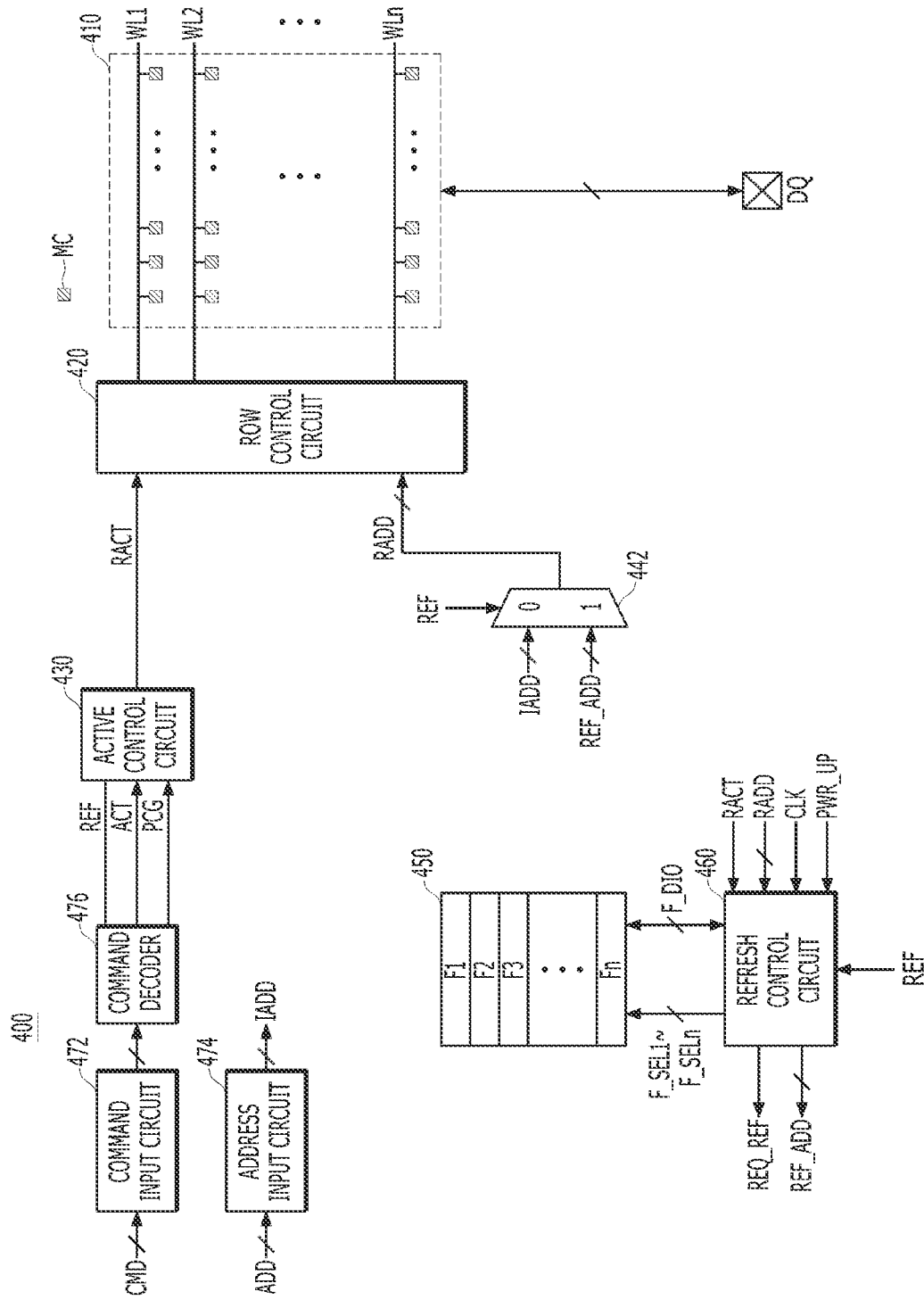
FIG. 12 is a detailed block diagram illustrating a memory device shown in FIG. 11 in accordance with an embodiment of the present invention.

FIG. 12 is a detailed block diagram illustrating the memory device 400 shown in FIG. 11 in accordance with an embodiment of the present invention.

Referring to FIG. 12, the memory device 400 may include a memory cell array 410, a row control circuit 420, an active control circuit 430, an address selection circuit 442, a time table 450, a refresh control circuit 460, a command input circuit 472, an address input circuit 474, and a command decoder 476. Since the memory cell array 410, the row control circuit 420, the active control circuit 430, the time table 450, the command input unit 472, the address input unit 474, and the command decoder 476 of FIG. 12 have substantially the same configuration as those of FIG. 2, a detailed description thereof will be omitted.

The address selection circuit 442 may select one of an input address IADD and a refresh address REF_ADD in response to a refresh command REF, and output the selected address as a row address RADD. For example, when the refresh command REF is input, the address selection circuit 442 may output the row address RADD by selecting the refresh address REF_ADD.

The refresh control circuit 460 may select a k-th word line WLk from first to n-th word lines WL1 to WLn based on the row address RADD and a row active signal RACT, to activate a k-th field selection signal F_SELk corresponding to the selected k-th word line WLk, among first to n-th field selection signals F_SEL1 to F_SELn. When the field data F_DIO are output from the k-th field Fk in response to the k-th field selection signal F_SELk, the refresh control circuit 460 may calculate a difference between the field data F_DIO and current clock data generated based on an oscillating signal CLK, and issue the refresh request signal REQ_REF when the calculated difference is greater than or equal to a preset refresh period. The refresh control circuit 460 may update the field data F_DIO of the k-th field Fk using the current clock data regardless of whether the refresh request signal REQ_REF is issued.

In particular, when the refresh request signal REQ_REF is issued, the refresh control circuit 460 may store the row address RADD designating the selected k-th word line WLk, and provide the stored address to the address selection circuit 442 as the refresh address REF_ADD.

Figure 13:
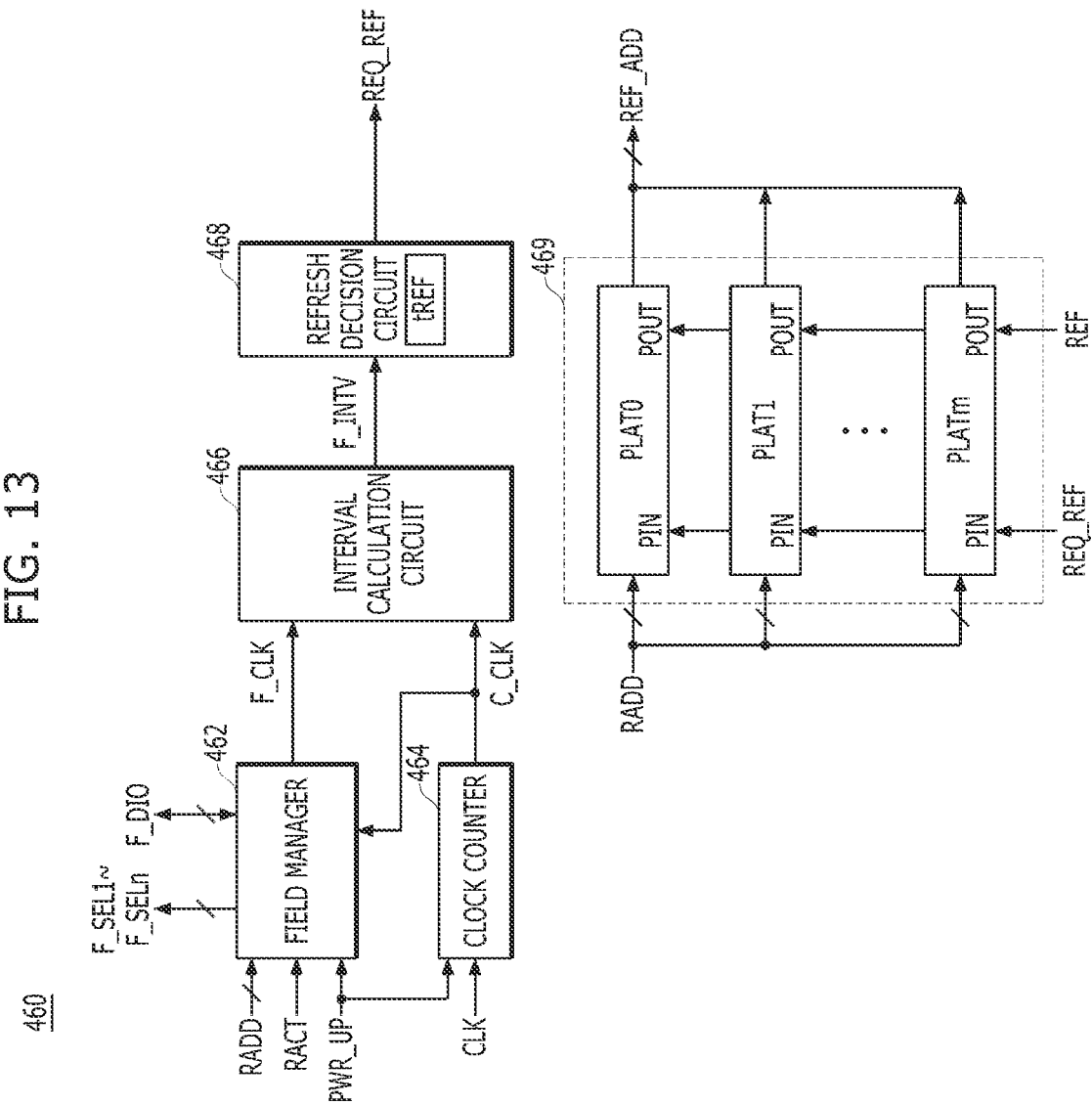
FIG. 13 is a detailed block diagram illustrating a refresh control circuit of FIG. 12 in accordance with an embodiment of the present invention.

FIG. 13 is a detailed block diagram illustrating the refresh control circuit 460 of FIG. 12 in accordance with an embodiment of the present invention.

Referring to FIG. 13, the refresh control circuit 460 may include a field manager 462, a clock counter 464, an interval calculation circuit 466, a refresh decision circuit 468, and a refresh address output circuit 469. Since the field manager 462, the clock counter 464, the interval calculation circuit 466, and the refresh decision circuit 468 of FIG. 13 have substantially the same configuration as those of FIG. 4, a detailed description thereof will be omitted.

The refresh address output circuit 469 may include a plurality of pipe latches PLAT0 to PLATm that receive the refresh request signal REQ_REF as an input control signal PIN and receive the refresh command REF as an output control signal POUT. The pipe latches PLAT0 to PLATm may sequentially store the row address RADD whenever the refresh request signal REQ_REF is issued, and sequentially output the stored addresses as the refresh address REF_ADD whenever the refresh command REF is input.

Hereinafter, an operation of the memory device 400 of FIGS. 12 and 13 will be described below with reference to FIG. 6.

When power-up, the field manager 462 may initialize all field data F_DIO of the first to n-th fields F1 to Fn of the time table 450 according to the power-up signal PWR_UP (at operation S110). At this time, the clock counter 464 may start generating the current clock data C_CLK by counting the oscillating signal CLK.

When the active command ACT or the refresh command REF is input, the active control circuit 430 may activate the row active signal RACT. When the active command ACT is input, the address selection circuit 442 may select and output the input address IADD as the row address RADD.

The field manager 462 may decode the row address RADD to activate one of the first to n-th field selection signals F_SEL1 to F_SELn (at operation S120). The field data F_DIO may be read from the selected field according to the activated field selection signal (at operation S130). The field manager 462 may provide the read field data F_DIO as the field clock data F_CLK to the interval calculation circuit 466.

Thereafter, the field manager 462 may update the field data F_DIO of the selected field using the current clock data C_CLK (at operation S140). The interval calculation circuit 466 may generate the interval signal F_INTV by calculating an interval between the field clock data F_CLK and the current clock data C_CLK (at operation S150).

The refresh decision circuit 468 may issue the refresh request signal REQ_REF (at operation S170) when the interval signal F_INTV is greater than or equal to the preset refresh period tREF ("YES" in operation S160). At this time, the refresh address output circuit 469 may store the row address RADD into any of the pipe latches PLAT0 to PLATm in response to the refresh request signal REQ_REF. On the other hand, when the calculated interval signal F_INTV is less than the preset refresh period tREF ("NO" in operation S160), the refresh decision circuit 468 may terminate the operation without issuing the refresh request signal REQ_REF.

When the refresh request signal REQ_REF is input from the memory device 400, the memory controller 500 may provide the refresh command REF to the memory device 400. The refresh address output circuit 469 of the memory device 400 may output the stored addresses in any of the pipe latches PLAT0 to PLATm, as the refresh address REF_ADD, in response to the refresh command REF. As a result, the row control circuit 420 may refresh a word line corresponding to the refresh address REF_ADD in response to the refresh command REF.

Figure 14:
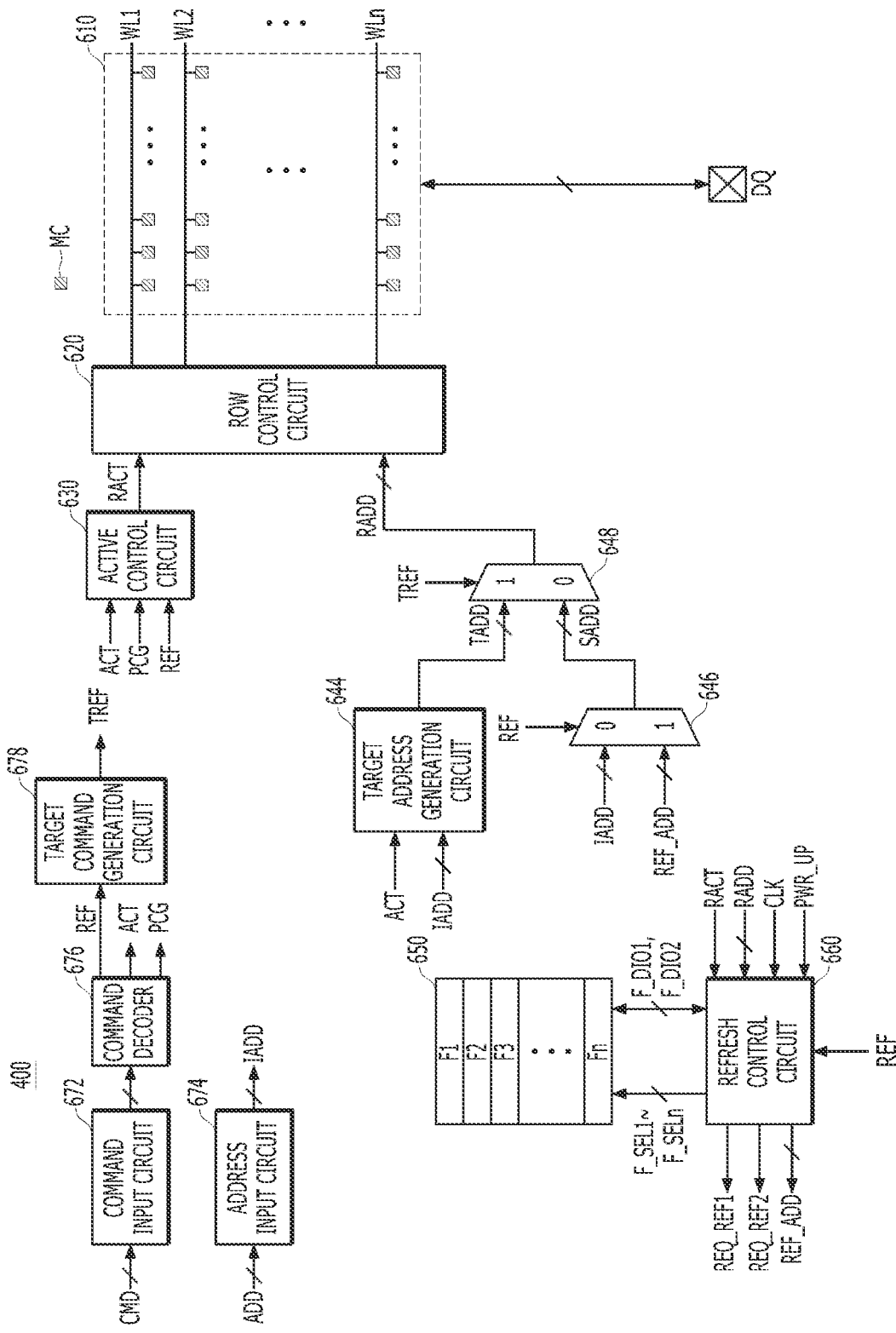
FIG. 14 is a detailed block diagram illustrating a memory device shown in FIG. 11 in accordance with another embodiment of the present invention.

FIG. 14 is a detailed block diagram illustrating the memory device 400 shown in FIG. 11 in accordance with another embodiment of the present invention.

Referring to FIG. 14, the memory device 400 may include a memory cell array 610, a row control circuit 620, an active control circuit 630, a target address generation circuit 644, a first address selection circuit 646, a second address selection circuit 648, a time table 650, a refresh control circuit 660, a command input circuit 672, an address input circuit 674, a command decoder 676, and a target command generation circuit 678. Since the memory cell array 610, the row control circuit 620, the active control circuit 630, the target address generation circuit 644, the time table 650, the command input unit 672, the address input unit 674, the command decoder 676, and the target command generation circuit 678 of FIG. 14 have substantially the same configuration as those of FIG. 7, a detailed description will be omitted.

The first address selection circuit 646 may output a selection address SADD by selecting one of an input address IADD and a refresh address REF_ADD in response to a refresh command REF. For example, when the refresh command REF is input, the first address selection circuit 646 may select and output the refresh address REF_ADD as the selection address SADD.

The second address selection circuit 648 may output a row address RADD by selecting one of a target address TADD and the selection address SADD in response to a target refresh command TREF. For example, when the target refresh command TREF is input, the second address selection circuit 648 may select and output the target address TADD as the row address RADD.

The refresh control circuit 660 may read first field data F_DIO1 and second field data F_DIO2 from a k-th filed corresponding to a k-th word line WLk from first to n-th word lines WL1 to WLn, based on the row address RADD and a row active signal RACT. The refresh control circuit 660 may determine whether to issue a first refresh request signal REQ_REF1 based on a current clock data and the first field data F_DIO1, and determine whether to issue a second refresh request signal REQ_REF2 based on a comparison result of a preset threshold number and the second field data F_DIO2. The refresh control circuit 660 may update the first field data F_DIO1 using the current clock data, and update the second field data F_DIO2 to be increased by "one (i.e., +1)" or initialized depending on whether the second refresh request signal REQ_REF2 is issued or not.

In particular, the refresh control circuit 660 may store the row address RADD specifying the selected k-word line WLk when the first refresh request signal REQ_REF1 is issued, and may store the row address RADD specifying adjacent word lines of the selected k-word line WLk when the second refresh request signal REQ_REF2 is issued. The refresh control circuit 660 may provide the stored address to the first address selection circuit 646 as the refresh address REF_ADD, according to the refresh command REF.

Figure 15:
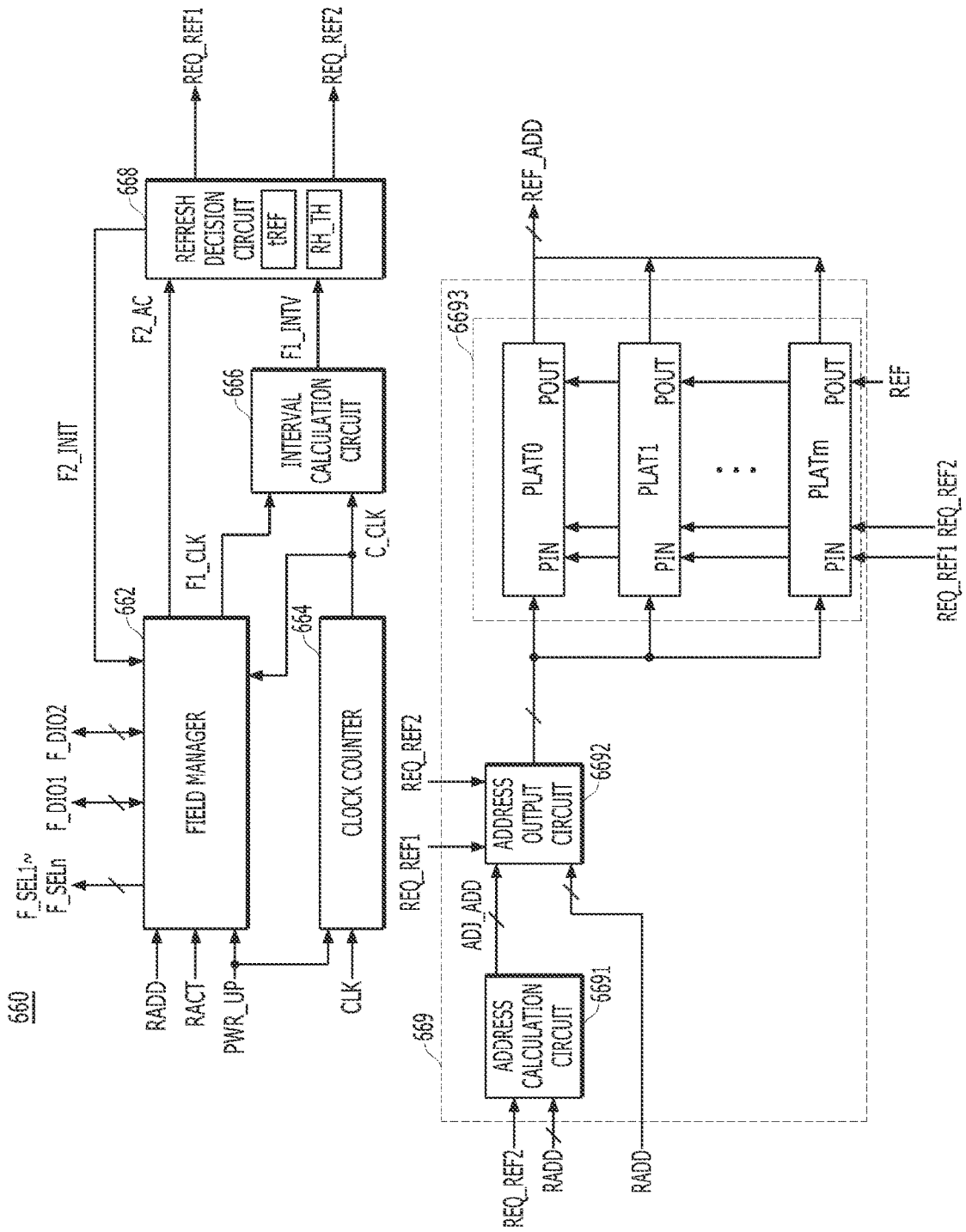
FIG. 15 is a detailed block diagram illustrating a refresh control circuit of FIG. 14 in accordance with another embodiment of the present invention.

FIG. 15 is a detailed block diagram illustrating the refresh control circuit 660 of FIG. 14 in accordance with another embodiment of the present invention.

Referring to FIG. 15, the refresh control circuit 660 may include a field manager 662, a clock counter 664, an interval calculation circuit 666, a refresh decision circuit 668, and a refresh address output circuit 669. Since the field manager 662, the clock counter 664, the interval calculation circuit 666, and the refresh decision circuit 668 of FIG. 15 have substantially the same configuration as those of FIG. 9, a detailed description will be omitted.

The refresh address output circuit 669 may include an address calculation circuit 6691, an address output circuit 6692, and an address storing circuit 6693.

The address calculation circuit 6691 may calculate one or more adjacent addresses ADJ_ADD using the row address RADD when the second refresh request signal REQ_REF2 is issued.

The address output circuit 6692 may output the row address RADD according to the first refresh request signal REQ_REF1, and may output the adjacent addresses ADJ_ADD according to the second refresh request signal REQ_REF2.

The address storage circuit 6693 may include a plurality of pipe latches PLAT0 to PLATm that receive the first refresh request signal REQ_REF1 or the second refresh request signal REQ_REF2 as an input control signal PIN, and receive the refresh command REF as an output control signal POUT. The pipe latches PLAT0 to PLATm may sequentially store addresses output from the address output circuit 6692 whenever the first refresh request signal REQ_REF1 or the second refresh request signal REQ_REF2 is issued, and may sequentially output the stored addresses as the refresh address REF_ADD whenever the refresh command REF is input.

Hereinafter, an operation of the memory device 400 of FIGS. 14 and 15 will be described below with reference to FIG. 10.

When power-up, the field manager 662 may initialize all of the first field data F_DIO1 and the second field data F_DIO2 of the first to n-th fields F1 to Fn according to the power-up signal PWR_UP (at operation S310).

When the active command ACT or the refresh command REF is input, the active control circuit 630 may activate the row active signal RACT. When the active command ACT is input, the first and second address selection circuits 646 and 648 may select and output the input address IADD as the row address RADD. When the row active signal RACT is activated, the field manager 662 may decode the row address RADD to activate one of the first to n-th field selection signals F_SEL1 to F_SELn (at operation S320).

First, the first field data F_DIO1 may be read from the selected field according to the activated field selection signal (at operation S330). The field manager 662 may provide the first field data F_DIO1 as field clock data F1_CLK to the interval calculation circuit 666. Then, the field manager 662 may update the first field data F_DIO1 of the selected field using current clock data C_CLK (at operation S340). The interval calculation circuit 666 may generate an interval signal F1_INTV by calculating an interval between the field clock data F1_CLK and the current clock data C_CLK (at operation S350).

When the interval signal F1_INTV is greater than or equal to a preset refresh period tREF ("YES" in operation S360), the refresh decision circuit 668 may issue the first refresh request signal REQ_REF1 (at operation S370). At this time, the refresh address output circuit 669 may store the row address RADD into any of the pipe latches PLAT0 to PLATm in response to the first refresh request signal REQ_REF1. On the other hand, when the calculated interval signal F1_INTV is less than the preset refresh period tREF ("NO" in operation S360), the refresh decision circuit 668 may terminate the operation without issuing the first refresh request signal REQ_REF1.

When the first refresh request signal REQ_REF1 is input from the memory device 400, the memory controller 500 may provide the refresh command REF to the memory device 400. The refresh address output circuit 669 of the memory device 400 may output the stored addresses in any of the pipe latches PLAT0 to PLATm, as the refresh address REF_ADD, in response to the refresh command REF. The first and second address selection circuits 646 and 648 may select and output the refresh address REF_ADD as the row address RADD. As a result, the row control circuit 620 may refresh a word line corresponding to the refresh address REF_ADD in response to the refresh command REF.

Next, the second field data F_DIO2 may be read from the selected field according to the activated field selection signal (at S430). The field manager 662 may provide the second field data F_DIO2 as field counting data F2_AC to the refresh decision circuit 668. When the field counting data F2_AC is greater than or equal to a preset threshold number RH_TH ("YES" in S440), the refresh decision circuit 668 may issue the second refresh request signal REQ_REF2 (at S470). When it is determined that the second refresh request signal REQ_REF2 is issued, the refresh decision circuit 668 may activate the second field initialization signal F2_INIT, and the field manager 662 may initialize the second field data F_DIO2 of the selected field (at S450). At this time, the refresh address output circuit 669 may store the adjacent addresses ADJ_ADD into any of the pipe latches PLAT0 to PLATm in response to the second refresh request signal REQ_REF2.

On the contrary, when the field count data F2_AC is less than the preset threshold number RH_TH ("NO" in S440), the refresh decision circuit 668 may terminate the operation without issuing the second refresh request signal REQ_REF2. When the second refresh request signal REQ_REF2 is not issued, the refresh decision circuit 668 may deactivate the second field initialization signal F2_INIT, and the field manager 662 may increase the second field data F_DIO2 by "one (i.e., +1)" (at S460).

When the second refresh request signal REQ_REF2 is input from the memory device 400, the memory controller 500 may provide the refresh command REF to the memory device 400. The refresh address output circuit 669 of the memory device 400 may output the stored addresses in any of the pipe latches PLAT0 to PLATm, as the refresh address REF_ADD, in response to the refresh command REF. The first and second address selection circuits 646 and 648 may select and output the refresh address REF_ADD as the row address RADD. As a result, the row control circuit 620 may refresh a word line corresponding to the refresh address REF_ADD in response to the refresh command REF.

Moreover, when the active command ACT Is input, the target address generation circuit 644 may generate the target address TADD by sampling the input address IADD. The target command generation circuit 678 may generate the target refresh command TREF whenever the number of inputs of the refresh command REF reaches a predetermined number of times. When the target refresh command TREF is generated, the address selection circuit 648 may select and output the target address TADD as the row address RADD, and the row control circuit 620 may perform a target refresh operation by refreshing the word line corresponding to the row address RADD In response to the row active signal RACT.

Various embodiments of the present invention have been described in the drawings and specification. Although specific terminologies are used here, the terminologies are only to describe the embodiments of the present invention. Therefore, the present invention is not restricted to the above-described embodiments and many variations are possible within the spirit and scope of the present invention. It should be apparent to those skilled in the art that various modifications can be made based on the technological scope of the present invention in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal. Furthermore, the embodiments may be combined to form additional embodiments.

What is claimed is:

1. A memory device comprising:
a memory cell array including a plurality of rows;
a time table including a plurality of fields respectively corresponding to the rows; and
a refresh control circuit configured to read field data from a k-th field of the time table according to an access command for a k-th row among the rows, where k is a natural number, determine whether to issue a refresh request signal for the k-th row based on current clock data and the field data, and update the field data of the k-th field using the current clock data so that each of the plurality of fields stores a last access time of a corresponding row,
wherein the refresh control circuit is configured to issue the refresh request signal whenever a difference between a decimal value of the updated field data for the last access time and a decimal value of the current clock data is greater than or equal to a preset refresh period, to thereby perform a refresh operation non-periodically according to an actual access point of each of the rows.

2. The memory device of claim 1, wherein the refresh control circuit is configured to provide a row address designating the k-th row as a refresh address, when the refresh request signal is issued.

3. The memory device of claim 2, further comprising a row control circuit configured to refresh a row corresponding to an input address provided from a memory controller according to a refresh command provided from the memory controller.

4. The memory device of claim 1, wherein the refresh control circuit is configured to store a row address designating the k-th row when the refresh request signal is issued, and to provide the stored address as a refresh address according to a refresh command provided from a memory controller.

5. The memory device of claim 4, further comprising a row control circuit configured to refresh a row corresponding to the refresh address according to the refresh command.

6. The memory device of claim 1, wherein the refresh control circuit includes:
a field manager configured to decode a row address to activate one of a plurality of field selection signals when the access command is input, read the field data from the field of the time table selected according to the activated field selection signal, and update the field data of the selected field using the current clock data;
an interval calculation circuit configured to calculate an interval difference between an access time corresponding to the current clock data and an access time corresponding to the field data read from the selected field; and
a refresh decision circuit configured to determine whether the refresh request signal is issued or not according to a comparison result of the preset refresh period and the calculated interval difference.

7. The memory device of claim 6, wherein the field manager is configured to initialize all of the field data of the time table according to a power-up signal.

8. The memory device of claim 6, wherein the refresh control circuit further includes:
a clock counter configured to generate the current clock data by counting an oscillating signal according to a power-up signal; and
a refresh address output circuit configured to provide the row address as a refresh address, when the refresh request signal is issued.

9. The memory device of claim 6, wherein the refresh control circuit further includes:
a clock counter configured to generate the current clock data by counting an oscillating signal according to a power-up signal; and
a refresh address output circuit configured to store the row address when the refresh request signal is issued, and provide the stored address as a refresh address according to a refresh command provided from a memory controller.

10. A memory device comprising:
a memory cell array including a plurality of rows;
a time table including a plurality of fields respectively corresponding to the rows, each field storing a last access time of a corresponding row as first field data; and
a refresh control circuit configured to read the first field data from a k-th field of the time table according to an access command for a k-th row among the rows, where k is a natural number, and determine whether to issue a first refresh request signal for the k-th row based on current clock data and the first field data read from the k-th field,
wherein the refresh control circuit is configured to issue the first refresh request signal whenever a difference between a decimal value of the updated field data for the last access time and a decimal value of the current clock data is greater than or equal to a preset refresh period, to thereby perform a refresh operation non-periodically according to an actual access point of each of the rows.

11. The memory device of claim 10, wherein each field is further configured to store a number of activations of the corresponding row as second field data.

12. The memory device of claim 11, wherein the refresh control circuit is configured to determine whether to issue a second refresh request signal for adjacent rows of the k-th row based on a comparison result of a preset threshold number and the second field data read from the k-th field.

13. The memory device of claim 12, wherein the refresh control circuit is configured to update the first field data of the k-th field using the current clock data after the first field data are read from the k-th field, and to increase or initialize the second field data of the k-th field depending on whether the second refresh request signal is issued or not, after the second field data are read from the k-th field.

14. The memory device of claim 12, wherein the refresh control circuit includes:
a field manager configured to decode a row address to activate one of a plurality of field selection signals when the access command is input, and read the first field data and the second field data from the field of the time table selected according to the activated field selection signal;
an interval calculation circuit configured to calculate an interval difference between an access time corresponding to the current clock data and an access time corresponding to the first field data; and
a refresh decision circuit configured to determine whether the first refresh request signal is issued or not according to a comparison result of the preset refresh period and the calculated interval difference, and determine whether the second refresh request signal is issued or not according to a comparison result of a preset threshold number and the second field data.

15. The memory device of claim 14, wherein the field manager is configured to initialize all of the first field data and the second field data of the time table according to a power-up signal.

16. The memory device of claim 14, wherein, after the first field data and the second field data are read from the selected field, the field manager is configured to update the first field data of the selected field using the current clock data, and to increase the second field data of the selected field when the second refresh request signal is not issued, and to initialize the second field data of the selected field when the second refresh request signal is issued.

17. The memory device of claim 14, wherein the refresh decision circuit is configured to issue the first refresh request signal when the calculated interval difference is greater than or equal to the preset refresh period, and to issue the second refresh request signal when the second field data is greater than or equal to the preset threshold number.

18. The memory device of claim 14, wherein the refresh control circuit further includes:
 a clock counter configured to generate the current clock data by counting an oscillating signal according to a power-up signal; and
 a refresh address output circuit configured to provide the row address as a refresh address, when the first refresh request signal is issued, and provide one or more adjacent addresses to the row address, as the refresh address, when the second refresh request signal is issued.

19. The memory device of claim 14, wherein the refresh control circuit further includes:
 a clock counter configured to generate the current clock data by counting an oscillating signal according to a power-up signal; and
 a refresh address output circuit configured to store the row address when the first refresh request signal is issued, store one or more adjacent addresses to the row address when the second refresh request signal is issued, and provide the stored address as a refresh address according to a refresh command provided from a memory controller.

20. A memory system comprising:
 a memory controller; and
 a memory device including a plurality of memory cells, a plurality of word lines, and a table storing a latest access time for each word line,
 wherein the memory device is configured to:
 determine, through the table, a latest access time for a word line selected from among the plurality of the word lines;
 determine an interval between the latest access time and a current time;
 determine whether the interval is greater than or equal to a set refresh period;
 when it is determined that the interval is greater than or equal to the set refresh period, provide, to a memory controller, a refresh request signal;
 receive, from the memory controller, a refresh command in response to the refresh request signal; and
 refresh, in response to the refresh command, at least one word line corresponding to at least one refresh address including an address associated with the selected word line, by recharging capacitors of the memory cells coupled to the at least one word line, to thereby refresh each of the word lines non-periodically according to an actual access point of each word line.

21. The memory system of claim 20, wherein the refresh address further includes addresses adjacent to the address.

* * * * *